United States Patent [19]

Roza

[11] Patent Number: 4,816,771
[45] Date of Patent: Mar. 28, 1989

[54] AMPLIFIER ARRANGEMENT FOR AN ADAPTIVE REDUCTION OF AN UNWANTED D.C. OFFSET IN AN INPUT SIGNAL AND AN AM RECEIVER USING SAME

[75] Inventor: Engel Roza, Eindhoven, Netherlands

[73] Assignee: U.S. Philips Corporation, New York, N.Y.

[21] Appl. No.: 46,201

[22] Filed: May 4, 1987

[30] Foreign Application Priority Data

May 23, 1986 [NL] Netherlands .......................... 8601316

[51] Int. Cl.⁴ ............................................. H03F 1/26
[52] U.S. Cl. .......................................... 330/149; 330/9
[58] Field of Search ........................... 330/261, 749, 9; 307/542

[56] References Cited

U.S. PATENT DOCUMENTS 4,277,695 7/1981 Wilber et al. ....................... 307/542

Primary Examiner—Gene Wan
Attorney, Agent, or Firm—Michael E. Marion

[57] ABSTRACT

An amplifier arrangement for reducing an unwanted d.c. offset of an amplitude-varying input signal, has a threshold circuit ($A_3$, $B_3$) and an amplifier stage ($A_1$, $B_1$) coupled thereto, which threshold circuit ($A_3$, $B_3$) is provided with a bistable trigger circuit ($A_4$, $B_4$). This bistable trigger circuit ($A_4$, $B_4$) reduces the d.c. level of the input signal or output signal of the amplifier stage ($A_1$, $B_1$) in a steplike manner when this d.c. level increases. The bistable trigger circuit ($A_4$, $B_4$) has a hysteresis which is larger than the maximum amplitude variation of the input signal as a result of the desired signal component, so that a linear amplification of this desired signal component is possible and, in the case of a nonvarying d.c. level, variations of the input signal due to the desired signal component cannot give rise to a d.c. reduction. This amplifier arrangement may be used in a phase-locked loop of a directly mixing synchronous AM receiver, which phase-locked loop is used for generating a synchronous local carrier in order to increase the input dynamic range of the receiver.

14 Claims, 2 Drawing Sheets

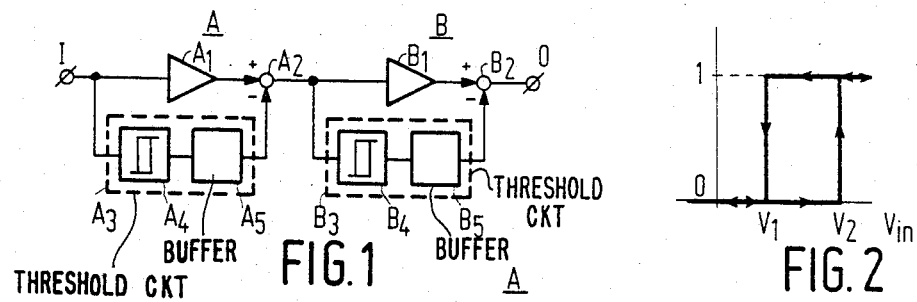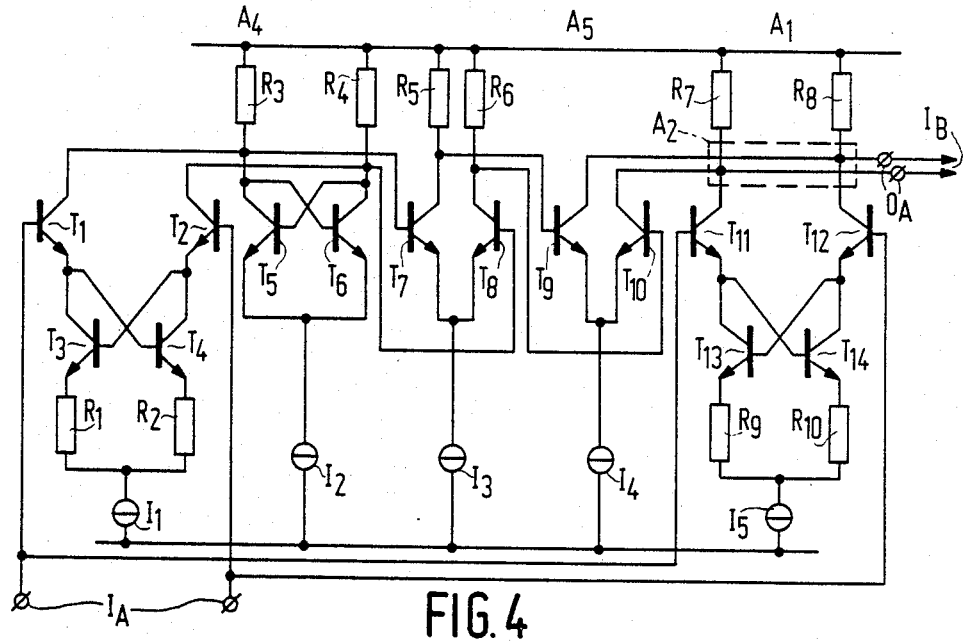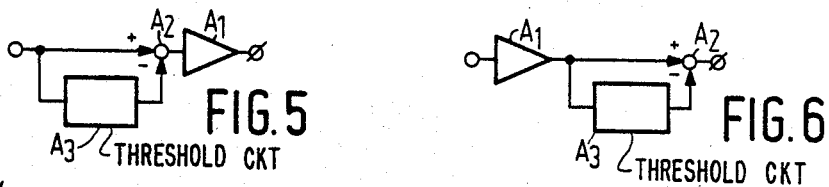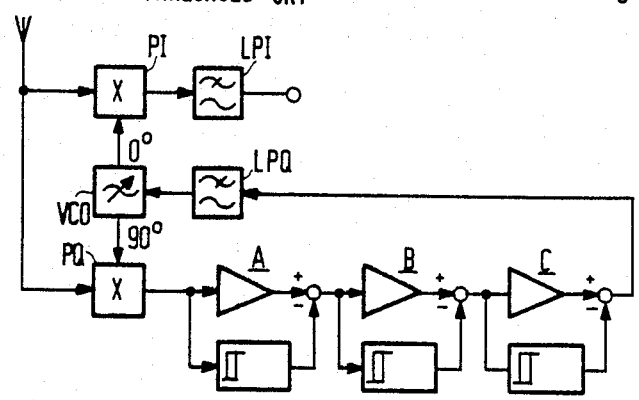

AMPLIFIER ARRANGEMENT FOR AN ADAPTIVE REDUCTION OF AN UNWANTED D.C. OFFSET IN AN INPUT SIGNAL AND AN AM RECEIVER USING SAME

BACKGROUND OF THE INVENTION

The invention relates to an amplifier arrangement for amplifying an amplitude-varying input signal and for reducing an unwanted d.c. offset thereof, comprising a threshold circuit and an amplifier stage coupled thereto, and to a directly mixing synchronous AM-receiver having an RF input, which is coupled at one end to a synchronous AM detector and at the other end to a phase-locked loop for generating a local carrier which is phase-coupled with the carrier of the RF reception signal, said phase-locked loop comprising a phase detector, a loop filter and a voltage-controlled oscillator successively arranged in a loop configuration.

An amplifier arrangement of this type is known from U.S. Pat. No. 4,277,695. A directly mixing & synchronous AM receiver of the type described above is known from British patent specification No. 2,130,826.

The threshold circuit of the known amplifier arrangement is adjustable and is used to adjust that part of the input signal for which there is no amplification. A correctly chosen adjustment of this so-called dead zone provides the possibility of suppressing unwanted d.c. offsets which may have been cause for example, by noise and parasitic d.c. disturbances, and only the desired amplitude varying signal component is amplified.

In the known amplifier arrangement, however, the desired signal component is non-linearly amplified and for a correct adjustment of the dead zone the amplitude of the unwanted d.c. offset to be reduced should be known in advance.

In practice this is not always the case and the unwanted d.c offset of the input signal to be amplified may be greatly dependent on the form in which the relevant circuit arrangement is realized, or may be influenced by the signal to noise level of the input signal or by ambient factors, or is difficult to distinguish from a desired signal component whose amplitude variation is only small relative to the d.c. offset, as may occur for example, in the phase control signal of a phase-locked loop.

SUMMARY OF THE INVENTION

A first object of the invention is to provide an amplifier arrangement for an adaptive reduction of an unwanted d.c. offset in an input signal varying in amplitude due to a desired signal component, which arrangement is particularly suitable for use with input signals whose unwanted d.c. offset is unknown and may be many times larger than the amplitude variation of the desired signal component which is to be linearly amplified.

According to the invention an amplifier arrangement of the type described in the opening paragraph is characterized in that the threshold circuit includes a bistable trigger circuit which changes from an active state to an initial state when the input signal amplitude comes below a first threshold level and which changes from the initial state to the active state when the input signal amplitude exceeds a second, threshold level, which two threshold levels bound a hysteresis characteristic is larger than the maximum desired amplitude variation of the input signal, said bistable trigger circuit being coupled to a d.c. compensation circuit incorporated in the signal path of the amplifier arrangement and applying a trigger signal to said circuit in the active state for reducing the d.c. level of the signal applied via the signal path to the d.c. compensation circuit by a certain step value.

The invention is based on the recognition that, an adaptive d.c. reduction as well as a linear amplification of the desired amplitude varying signal component is possible by means of an amplifier arrangement having a sawtooth-shaped output characteristic with each of its useful slopes—for example, a rising slope in the case of an increasing input amplitude -being larger than the maximum amplitude variation range of the desired signal component and by using means for preventing the discontinuities in the sawtooth shaped output characteristic from occurring within this amplitude variation range.

If the measure according to the invention is used, such a sawtooth-shaped output characteristic is realized by subtracting in said d.c. compensation circuit a preselected from d.c. value—hereinafter referred to as reduction step—from the input or output signal of the amplifier stage as soon as the input signal exceeds a given threshold This threshold is provided with a hysteresis characteristic of the aforementioned value by means of the bistable trigger circuit so as to prevent the occurrence of amplitude dependent discontinuities in the amplification of the amplitude varying signal component. This desired signal component is linearly amplified thereby and cannot give rise in the d.c. compensation circuit to a continuous alternation of d.c. level reduction and restoration, not even in input signals having an average level at or near the threshold.

In a preferred embodiment which is characterized in that the input of the amplifier stage is also the input of the threshold circuit and in which the d.c. compensation circuit is coupled to the output of the amplifier stage, a forward d.c. offset reduction therewith being obtained so that a comparatively large reduction step can be chosen without oscillation occurring.

A further preferred embodiment is characterized in that the said amplifier stage, threshold circuit and d.c. compensation circuit constitute a single section of a cascade arrangement of n sections mutually corresponding in their circuit configuration, the reduction step value of each of the (n−1) sections first in the signal direction being larger than the hysteresis of the section respectively subsequent thereto.

If this measure is used, a very accurate quantisation and hence a substantially complete suppression of the unknown d.c. offset to be suppressed becomes possible, an optimum amplification linearity within a large input range being obtainable.

Still another preferred embodiment is characterized in that the threshold levels of the sections transposed to the input of the amplifier arrangement are distributed substantially, regularly over the input range of the amplifier arrangement and in that the reduction step value and hysteresis of the sections transposed to the output of the amplifier arrangement are mutually substantially equal. The input amplitude values for which a d.c. reduction occurs are then evenly distributed within the input range.

A second object of the invention is to increase the input sensitivity of a directly mixing synchronous AM receiver.

According to the invention a directly mixing synchronous AM receiver of the type described in the opening paragraph is therefore characterized in that an amplifier arrangement as defined in the foregoing is arranged between the phase detector and the loop filter for a suppression of a parasitic d.c. offset in the phase control signal of the loop.

If this measure is used, unwanted, parasitic d.c. offsets in the phase control signal of the phase-controlled loop are prevented or at least greatly reduced. Consequently, phase errors between the local carrier regenerated in the voltage-controlled oscillator of the loop and the RF reception carrier do not occur or hardly occur and are acceptably small, even in the case of a very small reception field strength. The phase synchronism thus obtained between said two carriers ensures a correct synchronous demodulation of the AM-RF reception signal within a large field strength variation range, also referred to as reception dynamic range.

BRIEF DESCRIPTION OF THE DRAWINGS

The invention will be described in greater detail with reference to the Figures shown in the drawings.

In the drawings:

FIG. 1 shows a principle circuit diagram of an amplifier arrangement according to the invention, having two cascade-arranged sections, FIG. 2 shows the hysteresis characteristic of the bistable trigger circuit in each of the sections of the amplifier arrangement of FIG. 1, FIG. 4 shows a practical embodiment of a single section as used in duplicate in the amplifier arrangement of FIG. 1, FIG. 5 and FIG. 6 show further principle embodiments of an amplifier arrangement according to the invention, having one section, FIG. 7 shows a principle circuit diagram of a directly mixing synchronous AM receiver in which the amplifier arrangement of FIG. 1 is used.

DETAILED DESCRIPTION OF THE INVENTION & FIG. 1 shows an amplifier arrangement according to the invention, comprising between an input I and an output O two cascade-arranged sections A and B. These sections comprise in a mutually corresponding configuration amplifier stages $A_1$ and $B_1$ which are incorporated in the signal path of the amplifier arrangement, d.c. compensation circuits $A_2$ and $B_2$ which are coupled to the outputs of the amplifier stages $A_1$ and $B_1$ and threshold circuits $A_3$ and $B_3$, respectively, inputs of which correspond to the inputs of the amplifier stages $A_1$ and $B_1$ and outputs of which are coupled to the d.c. compensation circuits $A_2$ and $B_2$, respectively.

Figure 3:
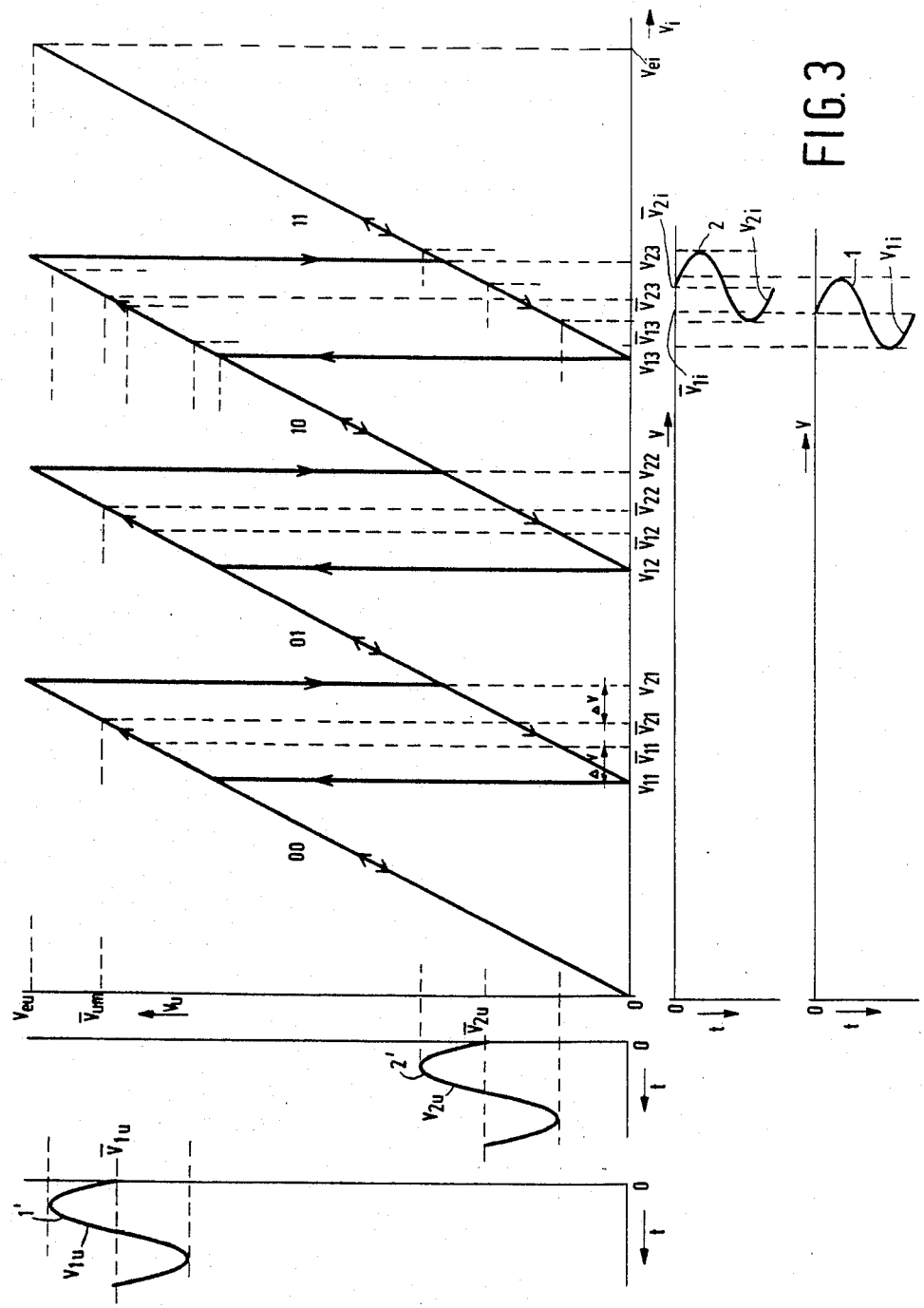
FIG. 3 shows the sawtooth-shaped output characteristic of the amplifier arrangement of FIG. 1.

Each of the two threshold circuits $A_3$ and $B_3$ is provided with a bistable trigger circuits $A_4$, $B_4$ respectively, each having a hysteresis characteristic provided, a Schmitt trigger which applies a two level control signal to the d.c. compensation circuits $A_2$ and $B_2$, respectively via a buffer stages $A_5$ and $B_5$, respectively. The buffer stage $A_5$, $B_5$ may be dispensed with by correct dimensioning of the trigger circuit $A_4$ and $B_4$.

The hysteresis effect of each of the two bistable trigger circuits $A_4$ and $B_4$ is illustrated in FIG. 2: with an input signal $V_{in}$ of the relevant trigger circuit, which signal is small, for example, smaller than a first threshold level $V_1$, this circuit is in a stable initial or 0 state in which it supplies a signal having a given low constant value, hereinafter referred to as the O signal. If $V_{in}$ increases, a stepwise transition takes place from this O state to a stable active or 1 state when $V_{in}$ exceeds a second threshold level $V_2$. In this stable 1 state the relevant trigger circuit supplies a signal having a constant high value, hereinafter referred to as 1 signal. A subsequent further increase of $V_{in}$ does not result in a change of state. If $V_{in}$ decreases below the first threshold level $V_1$ there is a return from this activation state to the initial state. Since the first threshold level $V_1$ is lower than the second threshold level $V_2$, a hysteresis is obtained which is located between $V_1$ and $V_2$. This hysteresis is chosen to be larger than the maximum occurring desired amplitude variation of $V_{in}$, or in other words larger than the maximum amplitude variation of the desired signal component.

In each of the two sections A and B the 1 signal in the active state is brought, if required, to a suitable constant d.c. or step value in the buffer stage coupled to the trigger circuit. In the d.c. compensation circuit of the relevant section coupled to the buffer and amplifier stage the d.c. reduction step value thus obtained is subsequently subtracted from the output signal of the last-mentioned amplifier stage resulting in a reduction of the d.c. offset of this output signal. An occurrence of the O signal in the initial state does not result in a d.c. reduction: the d.c. offset of the input signal applied to the relevant section is then acceptably small.

The amplifier arrangement as a whole has a substantially sawtooth-shaped output characteristic shown in an idealised form in FIG. 3, if the values of the threshold levels, the value of the reduction steps and amplification factors of the sections A and B are suitably chosen. The amplifier arrangement traverses four stable states which can be indicated by 00, 01, 10 and 11 at an increase of the input signal $V_i$ applied to the amplifier arrangement within an input range from 0 to $V_{ei}$. The two bits in each word indicate the state (0 or 1 state) of the respective trigger circuits A and B.

The input signal $V_i$ of the amplifier arrangement can be considered as a superposition of a desired signal component $V_s$ having a given maximum amplitude $\Delta V$, which is known in advance, upon an average signal level $\overline{V}_i$, which is unknown. $\overline{V}_i$ is mainly caused by unwanted d.c. offsets and results in an unwanted d.c. offset $\overline{V}_u$ in the output signal $V_u$ of the amplifier arrangement, which offset is to be brought to or maintained at zero or at least at an acceptably small value. For a linear amplification of $V_s$ each of the input voltage ranges corresponding to the useful slopes of the sawteeth of the output characteristics is to be larger than the maximum amplitude variation to be expected in the input signal $V_i$ as a result of the desired signal component $V_s$, that is to say, larger than 2 V.

If $\overline{V}_i$ is zero or substantially zero and $\overline{V}_u$ is acceptably small, the amplifier arrangement is in the state 00 in which no d.c. reduction takes place. The amplifier arrangement then has no dead zone, or in other words, a dead zone being zero. In the case of a first increase of $\overline{V}_i$, for example, as a result of parasitic effects or a decreasing signal-to-noise ratio of the input signal $V_i$, $V_u$ increases until $V_i$ reaches a preselected input threshold level $V_{21}$. At that instant, $\overline{V}_i$ reaches the limit $\overline{V}_{21} = V_{21}\Delta V$ at which results in a still acceptable output d.c. offset $\overline{V}_{um}$. If $V_i$ further increases as a result of an increase of $\overline{V}_i$, at which $V_{21}$ is exceeded, the amplifier arrangement changes from the state 00 to the state 01. In this state 01, $\overline{V}_u$ is reduced by the reduction step of the section B of a preselected value $S_B$. The dead zone of the amplifier arrangement for input signals $V_i$ at these amplitude values is equal to the input signal amplitude corresponding to the size or value of the reduction step, that is to say, in the given example corresponding to an input threshold level $V_{11}$ to be described hereinafter. In the present case the input threshold level $V_{21}$ is equal to the threshold level $V_2$ of the bistable trigger circuit B4 transposed to the input I, that is to say, the second threshold level $V_2$ of the last-mentioned bistable trigger circuit B4 divided by the amplification factor of the amplifier stage $A_1$.

A still further increase of $V_i$ as a result of an increase of $\overline{V}_i$ results in a change from the state 01 to the state 10 when an input threshold level $V_{22}$ is exceeded and when the d.c. reduction step $S_A$ of the section A is chosen to be sufficiently large to reduce the input voltage of the section B to below its first threshold voltage $V_1$. The change of state of the bistable trigger circuit A4 from 0 to 1 then simultaneously produces a change of stage of the bistable trigger circuit B4 from 1 to 0. The input threshold level $V_{22}$ corresponds to the second threshold level $V_2$ of the bistable trigger circuit A4. The d.c. offset reduction of the output signal $V_u$ is determined in this state 10 by the value of the d.c. reduction step $S_A$ of the section A transposed to the output 0, that is to say, by the value of $S_A$ multiplied by by the amplification factor of the amplifier stage $B_1$. For the given case the dead zone of the amplifier arrangement is equal in this state to the input voltage range from O to an input threshold level $V_{12}$ to be described hereinafter.

Finally the state 11 is obtained in the case of a still further increase of $V_i$ which exceeds an input threshold level $V_{23}$. A double d.c. offset reduction of $V_u$ is then effected therein, which is equal to the sum of the aforementioned d.c. reduction steps of the sections A and B transposed to the output 0. In this state the dead zone of the amplifier arrangement is equal to the input range from O to an input threshold level $V_{13}$ to be described hereinafter. The input threshold level $V_{23}$ is not only determined by the second threshold levels $V_2$ of the bistable trigger circuits A4 and B4 transposed to the input I, but also by the value of $S_A$ and the amplification factor of the amplifier stage $A_1$.

If the input signal subsequently decreases, for example, as a result of a decrease of $\overline{V}_i$, the said four stable states are traversed in the reverse sequence and in the given situation the changes of state take place at the respective input threshold levels $V_{13}$, $V_{12}$ and $V_{11}$. With respect to the threshold levels $V_{23}$, $V_{22}$ and $V_{21}$, the levels $V_{13}$, $V_{12}$ and $V_{11}$ are chosen to have a voltage difference which is at least 2 $\Delta V$ lower. The input threshold levels $V_{13}$, $V_{12}$ and $V_{11}$ are determined in conformity with the input threshold levels $V_{23}$, $V_{22}$ and $V_{21}$ by the first threshold levels $V_1$ of the two sections A and B and the amplification factor and the value of the d.c. reduction step of the section A. In addition the working point of the amplifier arrangement is chosen to be such in the given case that the output signal $V_u$ is zero when a decreasing input signal $V_i$ comes below there levels. The mean input signal levels occurring at the said input threshold levels $V_{11}$, $V_{21}$, $V_{12}$, $V_{22}$, $V_{13}$, and $V_{23}$ are denoted by $\overline{V}_{11}$, $\overline{V}_{21}$, $\overline{V}_{12}$, $\overline{V}_{22}$, $\overline{V}_{13}$, and $\overline{V}_{23}$, respectively, in FIG. 3.

Hysteresis phenomena occur in the input voltage ranges between $V_{11}$ and $V_{21}$, $V_{12}$ and $V_{22}$ and $V_{13}$ and $V_{33}$ that is to say, amplification of input signals $V_i$ having an amplitude located in these so-called hysteresis ranges can take place in the states 00 or 01, 01 or 10 and 01 or 11, respectively. With said choice of each of these hysteresis ranges changes of state caused by the desired signal component $V_s$ are prevented from occurring so that this desired signal component $V_s$ linearly amplified in a stable state of the amplifier arrangement which does not change when a d.c. offset $\overline{V}_i$ does not change.

For the purpose of clarification reference is made of curves 1 and 2 in FIG. 3 which show the time-dependent variation of input signals $V_{1i}$ and $V_{2i}$ with d.c. offset levels $\overline{V}_{1i}$ and $\overline{V}_{2i}$, respectively, and a maximum amplitude variation 2 $\Delta V$ as a result of a desired signal component $V_s$.

$V_{1i}$ is entirely located within the hysteresis range between $V_{13}$ and $V_{23}$ so that $V_{1i}$ can be amplified in the state 10 or 11 of the amplifier arrangement, dependent on the direction from which $V_{1i}$ has reached the given level. If $V_{1i}$ has reached the said hysteresis range due to a p decrease of $\overline{V}_{1i}$, amplification takes place in the state 11;

if this has happened due to an increase of $\overline{V}_{1i}$, then amplification takes place in the state 10. In FIG. 3 the latter situation has been taken as a starting point and $\overline{V}_{1i}$ results in an output signal $V_{1u}$ with a desired signal component $V_{S1u}$ and an unwanted d.c. offset $\overline{V}_{1u}$. The time-dependent variation of $V_{1u}$ is shown by curve 1'. Due to d.c. offset reduction in the section A, which as mentioned hereinbefore takes place in the state 10, or a dead zone having the value of $V_{12}$, the ratio between the desired signal component and the unwanted d.c. offset ($V_{S1i}/\overline{V}_{1i}$) of the input signal $V_{1i}$ is much smaller than the ratio ($V_{S1u}/\overline{V}_{1u}$) of the output signal $V_1$, whilst the value of $\overline{V}_{1u}$ than the said maximum admissible occurring level of $\overline{V}_{um}$.

In the case of an amplification (not shown) of the same input signal $V_{1i}$ in the state 11, a d.c. offset reduction takes place both in the section A and in the section B so that in this state 11 the ratio ($\overline{V}_{S1u}/\overline{V}_{1u}$) is larger than in the state 01. The dead zone then extends from O to $V_{13}$.

The input signal $V_{2i}$ instantaneously passes the input threshold level $V_{23}$ and is amplified thereby in the state 11 in which a double d.c. offset reduction takes place and in which the dead zone extends from 0 to $V_{13}$ likewise as in the latter case. The output signal $V_{2u}$ is indicated by curve 2' and shows a ratio between the desired signal V component and the unwanted d.c. offset of $V_{s2u}/\overline{V}_{2u}$ which is considerably larger than the ratio ($V_{s2i}/\overline{V}_{2i}$) of the input signal $V_{2i}$, whilst $\overline{V}_{2u}$ is far below the said aceptable level $\overline{V}_{um}$. If $\overline{V}_{2i}$ decreases to below $\overline{V}_{13}$, $V_{2i}$ will be able to come below the threshold level $V_{13}$ and $V_{2i}$ is applied in the state 10 in which the d.c. level reduction only takes place in the section A and in which the dead zone extends from 0 to $V_{12}$. The ratio $V_{S2u}/\overline{V}_{2u}$ now still remains larger than $V_{S1i}/\overline{V}_{1i}$, whilst $\overline{V}_{2u}$ is smaller than $\overline{V}_{um}$.

A practical embodiment of the amplifier arrangement of FIG. 1 is balanced so that both positive and negative d.c. offsets can be reduced. FIG. 4 shows the section A of such balanced amplifier arrangement. Since the section B may have the same circuit configuration as the section A, this section has been omitted for the sake of simplicity. The working point of the amplifier arrangement is chosen to be such that an output characteristic is obtained whose shape corresponds to that in FIG. 3 but whose origin of the $V_i/V_u$ system of coordinates is shifted over $\frac{1}{2}V_{ei}$ and $\frac{1}{2}V_{eu}$.

The section A shown in FIG. 4 has a balanced signal input $I_A$, which corresponds to the input I of the amplifier arrangement of FIG. 1, and a balanced signal output $O_A$ which is coupled to a balanced input (not shown) of the section B.

The signal input $I_4$ is coupled at one end via a linear voltage current converter $T_1-T_4$, $R_1R_{2z}$, $I_1$ to the bistable trigger circuit $A_4$, which is realised by means of flip-flop $T_5$, $T_6$, $R_3$, $R_4$, $I_2$ and at the other end to a linear amplifier stage $A_1$, which is realised by means of the amplifier circuit $T_{11}-T_{14}$, $R_7-R_{10}$, $I_5$. The voltage current converter has a transistor pair $T_1T_2$ whose bases are coupled to the signal input $I_4$, the collectors constitute a balanced output of the corverter and the emitters are coupled to a linearizing the circuit for linearizing the conversion from input voltage to output current. This linearizing circuit has a transistor pair $T_3T_4$ whose collector-emitter paths are arranged in series with those of the transistor pair $T_1T_2$. The collectors of $T_3$ and $T_4$ are cross-coupled to the opposite bases, whilst the emitters are connected to ground via mutually equal emitter resistors $R_1$ and $R_2$ and a common emitter current source $I_1$. For each of the two transistors $T_1$ and $T_2$ of the transistor pair $T_1T_2$ the linearizing circuit produces a decrease of the collector current at an increase of the base voltage, that is to say, when the base voltage of $T_1$ has a positive voltage difference with respect to that of $T_2$, the collector current of $T_1$ is smaller than that of $T_2$ and conversely.

The bistable trigger circuit $A_4$ has an emitter-coupled transistor pair $T_5T_6$ whose mutually coupled emitters are connected to ground via a common emitter current source $I_2$ and whose collectors are cross-coupled to the opposite bases. These collectors are coupled to the collectors of the transistor pair $T_1T_2$ and are connected to a supply voltage via mutually equal, common collector resistors $R_3$, $R_4$, respectively. The hysteresis of $A_4$ can be adjusted by means of the current through the emitter current source $I_2$ and the resistors $R_3$, $R_4$. Due to the balanced design, the threshold levels which bound the hysteresis are located substantially symmetrical relative to a reference voltage, for example, $(V_1+V_2)/2$.

The trigger circuit $A_4$ is succeeded by the buffer state $A_5$ comprising cascade-arranged first and second emitter-coupled transistor pairs $T_7T_8$ and $T_9T_0$ each with a common emitter current source $I_3$ and $I_4$, respectively, being connected to ground. The bases of $T_7,T_8$ are coupled to the collectors of $T_5$, $T_6$ whilst the collectors are connected at one end to the supply voltage via mutually equal collector resistors $R_5$ and $R_6$ and at the other end to the bases of $T_9$, $T_{10}$. The buffer stage $A_5$ increases the edge steepness of the state transitions of the trigger circuit $A_4$. The step value is determined by the current through the transistors $T_9$ and $T_{10}$ and by the values of the collector resistors $R_8$ and $R_7$.

In a configuration similar to that of the said linear voltage current converter $(T_1-T_4, R_1, R_2, I_1)$ the amplifier stage $A_1$ has transistor pairs $T_{11}$, $T_{12}$ and $T_{13}$, $T_{14}$, emitter resistors $R_9$, $R_{10}$ and an emitter current source $I_5$ The bases of $T_{11}$, $T_{12}$ are connected to the signal input $I_4$, the collectors are mutually connected to the collectors of $T_{10}$, $T_9$ of the buffer stage A and are connected to the supply voltage via common collector resistors $R_7$, $R_8$, respectively. The aforementioned d.c. compensation circuit $A_2$ is constituted by these mutual connections. The last-mentioned collectors are also coupled to the output $O_A$ of the section A and are connected as such to the input of the section B (not shown).

In the present practical example the amplifier stage $A_1$ is proportioned in such a manner that its amplification factor is 2 and that the current of the emitter current source $I_5$ is four times as large as that of the emitter current source $I_4$ of the transistor pair $T_9$, $T_{10}$ The d.c. offset of the output signal $\overline{V}_u$ at the collectors of $T_{11}$ and $T_{12}$ is not only dependent on the d.c. shift of the input signal $V_i$, but also on the current through the transistors $T_{10}$ and $T_9$. The bistable trigger circuit $A_4$ is in the one stable state, for example, the 0 state when $T_5$ conducts and $T_6$ does not conduct, and it is in the other stable (1) state when $T_5$ does not conduct and $T_6$ conducts. In the O state $T_7$ will then be non-conducting and $T_8$ will be conducting so that $T_9$ conducts and $T_{10}$ does not conduct. The current through $T_9$ produces via $R_8$ a given d.c. level shift of the output signal of the amplifier stage $A_1$ so that the d.c. offset of the output signal remains below an admissible maximum for input signals $V_i$ which are amplified in this state, that is to say, input signals in which the collector current of $T_1$ is larger than that of $T_2$. If the input signal $V_i$ at the input $I_A$ increases from this 0 state, that is to say, if the base voltage of $T_1$ increases with respect to that of $T_2$, the base voltage of $T_6$ with respect to that of $T_5$ will have increased in the case of exceeding a positive (hereinbefore referred to as second) input threshold level in such a manner that the 0 state changes over to the 1 state. After the change over transition edge in the buffer stage $A_5$ has become steeper, this change-over results in a step-like d.c. offset reduction at the common collectors of $T_9$, $T_{12}$ and $T_{10}$, $T_{11}$ because the current through $R_7$ increases step-like with the collector current of $T_{10}$ and the current through $R_8$ is reduced by a current of the same step size, that is to say, the current of the emitter current source $I_4$. If the input signal $V_i$ decreases from this 1 state, a return to the original 0 state is not effected until after decreasing below a negative (hereinbefore referred to as first) input threshold level.

In a cascade arrangement of the section A with a section B corresponding thereto in its circuit configuration it is advantageous, at the given amplification factor of 2, to choose the hysteresis of the trigger circuit of the section B to be twice as large as that of the section A, that is to say, to choose the hysteresis of both sections A and B transposed to the input I of the amplifier arrangement to be mutually equal A uniform reduction behaviour is thereby obtained within the input signal range.

It will be evident that in the case of a suitable working point the circuit arrangement of FIG. 4 may also result in an output characteristic as is shown in FIG. 3 and that the use of the invention is not limited to the use of two sections. Thus, an amplifier arrangement according to the invention having 3 cascade-arranged sections will be able to assume 8 stable states if it is suitably proportional, which provides the possibility of a more accurate adjustment of the dead zone or, in other words, a more accurate reduction of the unwanted d.c. offset. In principle a realisation of the inventive idea with only one section is possible because a (single) d.c. reduction can already be effected therein.

Furthermore it should be noted that an output characteristic as shown in FIG. 3 can also be realised with a parallel arrangement (not shown) of four sections, namely one for each of the states 00, 01, 10 and 11. Although as compared with a serial construction having n sections as described hereinbefore an amplifier arrangement according to the invention having parallel sections requires more, namely $2^n$ sections for a comparable reduction behaviour, the output characteristic can be defined more accurately and more easily. The threshold levels transposed to the input of such an amplifier arrangement then correspond to the first and second 0 threshold levels of the bistable trigger circuits of the distinctive sections and they should generally be preferably chosen to be such that the hysteresis ranges of the sections are distributed in a mutually non-overlapping location over the input range of the amplifier arrangement, whilst the values of the reduction steps can be optimally chosen in dependence upon the desired output characteristic.

It will not be difficult to those skilled in the art to use the invention in a different form, for example, by arranging the d.c. compensation circuit in the signal direction prior to the amplifier stage in one or more sections after adaptation of the proportioning, as is shown in FIG. 5 or by arranging the amplifier stage in the signal direction prior to the threshold circuit, as is shown in FIG. 6. Realizations of the amplifier stage, the d.c. compensation circuit, the bistable trigger circuit and the buffer stage which are different from the one shown are alternatively possible.

FIG. 7 shows the use of a balanced amplifier arrangement according to the invention having 3 mutually equal sections A, B nd C in a phase-locked loop of a directly mixing synchronous AM receiver. This receiver includes a synchronous demodulator PI to which the RF-AM reception signal is applied on the one hand and a local mixing carrier which is in phase with the RF reception carrier is applied on the other hand. The desired AM modulation signal is selected from the mixing product obtained at the output of the synchronous demodulator PI via a lowpass filter LPI.

The local mixing carrier is generated in the phase-locked loop mentioned hereinbefore comprising a phase detector PQ having successively coupled thereto in a loop configuration the sections A, B and C of the amplifier arrangement according to the invention, a loop filter LPQ and a voltage-controlled oscillator $V_{CO}$ which supplies an in-phase and a quadrature oscillator signal. Both the quadrature oscillator signal of FCO and the RF-FM reception signals are applied to the phase detector PQ. The phase detector PQ supplies a signal which in the ideal case is zero at an exact phase quadrature relationship between the two signals and which proportionally varies in amplitude with phase differences between the two signals, deviating from this quadrature relationship.

This phase difference signal is applied as a phase control signal to the voltage-controlled oscillator $V_{CO}$ after amplification in the amplifier arrangement A, B and C and selection in the loop filter LPQ. In the case of a sufficiently large loop gain the quadrature oscillator signal accurately follows the RF reception carrier over a phase difference of 90° so that the in-phase oscillator signal is accurately in phase or in anti-phase with the latter carrier and a correct synchronous demodulation is effected in the synchronous demodulator PI.

Due to unwanted d.c. offsets occurring in practice, which in relation to the desired phase difference information component are particularly large in the case of small reception field strengths, the latter phase control signal is disturbed. This results in a phase asynchronicity between the RV reception carrier and the local in-phase oscillator signal which varies, for example, with the reception field strength, temperature or other causes of the said d.c. offsets and hence results in a disturbance of the demodulation of the RF reception signal. The amplifier arrangement A, B and C at the output of the phase detector PD reduces the unwanted d.c. offsets with respect to the phase difference information component of the phase control signal in the manner described hereinbefore, so that an accurate phase synchronisation is obtained. In practice the use of 3 sections in the amplifier arrangement is found to result in a sufficiently accurate d.c. reduction of the phase control signal so as to be ale to demodulate signals without interference within a large field strength variation range or input dynamic range comparable to that of conventional superheterodyne receivers.

I claim:

1. An amplifier arrangement for amplifying an amplitude-varying input signal and for reducing an unwanted d.c. offset thereof, comprising an threshold circuit and an amplifier stage coupled thereto, characterized in that the threshold circuit includes a bistable trigger circuit which changes from an active stage to an initial state when the input signal amplitude comes below a first threshold level and which changes from the initial state to the active state when the input signal amplitude exceeds a second threshold level, which two threshold levels define a hysteresis characteristic which is larger than the maximum desired amplitude variation of the input signal, said bistable trigger circuit being coupled to a d.c. compensation circuit incorporated in the signal path of the amplifier arrangement and applying a trigger signal to said circuit in the active state for reducing the d.c. level of the signal applied via the signal path to the d.c. compensation circuit by a certain step value.

2. An amplifier arrangement for amplifying an amplitude varying input signal and for furnishing an amplified output signal having a reduced d.c. offset level, comprising:
    (a) an amplifier stage;
    (b) d.c. compensation circuit connected to said amplifier stage; and
    (c) a threshold circuit which comprises a bistable circuit which changes from an active state to an initial stage when the amplitude of the input signal falls below a first threshold level and which changes from the initial stage to the active state when the amplitude of the input signal exceeds a second threshold level, said bistable circuit, when in the active state, applying a bistable output signal to said d.c. compensation circuit reducing the d.c. offset level of the amplified output signal by a certain value.

3. An amplifier arrangement as claimed in claim 2, characterized in that the input of the amplifier stage is also the input of the threshold circuit and in that the d.c. compensation circuit is coupled to the output of the amplifier stage.

4. An amplifier arrangement as claimed in claim 2, characterized in that the said amplifier stage, threshold circuit and d.c. compensation circuit constitute a single section of a parallel arrangement of at least two sections, the hysteresis ranges of the sections being distributed in a mutually non-overlapping location over the input signal range of the amplifier arrangement.

5. The amplifier arrangement of claim 2 wherein the first and second threshold levels define a hysteresis characteristic which is larger than the maximum amplitude variation of the input signal.

6. An amplifier arrangement as claimed in claim 5, characterized in that the said amplifier stage, threshold circuit and d.c. compensation circuit constitute a single section of a cascade arrangement of n sections mutually corresponding in their circuit configuration, the reduction step value of each of the (n−1) sections first in the signal direction being larger than the hysteresis of the subsequent section.

7. An amplifier arrangement as claimed in claim 6, characterized in that the threshold levels of the sections transposed to the input of the amplifier arrangement are distributed substantially regularly over the input range of the amplifier arrangement and in that the reduction step value and hysteresis of the sections transposed to the output of the amplifier arrangement are mutually substantially equal.

8. An amplifier arrangement as claimed in claim 5, characterized in that the said amplifier stage, threshold circuit and d.c. compensation circuit constitute a single section of a parallel arrangement of at least two sections, the hysteresis ranges of the sections being distributed in a mutually non-overlapping location over the input signal range of the amplifier arrangement.

9. An amplifier arrangement as claimed in claim 5, characterized in that the input of the amplifier stage is also the input of the threshold circuit and in that the d.c. compensation circuit is coupled to the output of the amplifier stage.

10. In a directly mixing synchronous AM receiver having RF input which is coupled at one end to a synchronous Am detector and at the other end to a phase-locked loop for generating a local carrier which is phase-coupled with the carrier of an RF reception signal, said phase-locked loop comprising a phase detector, a loop filter and a voltage controlled oscillator successively arranged in a loop configuration, the improvement characterized by an amplifier arrangement located between said phase detector and said loop filter, said amplifier arrangement comprising:
(a) an amplifier stage;
(b) d.c. compensation circuit connected to said amplifier stage; and
(c) a threshold circuit which comprises a bistable circuit which changes form an active state to an initial stage when the amplitude of the input signal falls below a first threshold level and which changes from the initial state to the active state when the amplitude of the input signal exceeds a second threshold level, said bistable circuit, when in the active state, applying a bistable output signal to said d.c. compensation circuit for suppressing a parasitic d.c. offset level in the phase control signal of the loop.

11. The receiver of claim 10 wherein the input of the amplifier stage is also the input of the threshold circuit and output of the amplifier stage is coupled to the d.c. compensation circuit.

12. The receiver of claim 10 wherein said amplifier stage, threshold circuit and d.c. compensation circuit constitute a single section of a cascade arrangement of N sections mutually corresponding in their circuit configuration, the reduction step value of each of the (N-1) sections first in the signal direction being larger than the hysteresis of the subsequent section.

13. The receiver of claim 11 further characterized in that the threshold level of the sections transposed to the input of the amplifier arrangement are distributed substantially regularly over the input range of the amplifier arrangement and in that the reduction step value and hysteresis of the sections transposed to the output of the amplifier arrangement are mutually substantially equal.

14. The receiver of claim 13 further characterized in that the said amplifier stage, threshold circuit and d.c. compensation circuit constitute a single section of a parallel arrangement of at least two sections, the hysteresis ranges of the sections being distributed in a mutually non-overlapping location over the input signal range of the amplifier arrangement.

* * * * *